United States Patent
Saylor et al.

(10) Patent No.: US 7,253,622 B2
(45) Date of Patent: Aug. 7, 2007

(54) HIGH FIELD HEAD COIL FOR DUAL-MODE OPERATION IN MAGNETIC RESONANCE IMAGING

(75) Inventors: Charles A. Saylor, Gainesville, FL (US); Yu Li, Gainesville, FL (US)

(73) Assignee: Invivo Corporation, Gainesville, FL (US)

( * ) Notice: Subject to any disclaimer, the term of this patent is extended or adjusted under 35 U.S.C. 154(b) by 0 days.

(21) Appl. No.: 11/334,241

(22) Filed: Jan. 17, 2006

(65) Prior Publication Data

US 2006/0158189 A1    Jul. 20, 2006

Related U.S. Application Data

(60) Provisional application No. 60/644,439, filed on Jan. 14, 2005.

(51) Int. Cl.
*G01V 3/00* (2006.01)
(52) U.S. Cl. ........................... 324/318; 600/422
(58) Field of Classification Search ................ 324/318, 324/322; 600/422
See application file for complete search history.

(56) References Cited

U.S. PATENT DOCUMENTS

| | | | |
|---|---|---|---|
| 4,506,224 A | 3/1985 | Krause | |
| 4,680,548 A | 7/1987 | Edelstein | |
| 4,751,464 A | 6/1988 | Bridges | |
| 5,053,711 A | 10/1991 | Hayes | |
| 5,132,621 A | 7/1992 | Kang | |
| 5,557,247 A | 9/1996 | Vaughn, Jr. | |
| 5,998,999 A * | 12/1999 | Richard et al. | 324/318 |
| 6,411,090 B1 | 6/2002 | Boskamp | |

(Continued)

FOREIGN PATENT DOCUMENTS

WO   WO 2004/048987   6/2004

OTHER PUBLICATIONS

King, Scott B. et al., A Four Channel Transceive Phased Array Head Coil for 3T, *Proc. Intl. Soc. Mag. Reson. Med*, 2001, pp. 12, vol. 9.
Moeller, S. et al., Parallel Imaging performance for densely spaced coils in phase arrays at ultra high field strength, *Proc. Intl. Soc. Mag. Reson. Med.*, 2004, vol. 11.
Vaughan, J.T., Detunable Transverse Electromagnetic (TEM) Volume Coil for High-Field NMR, *Magnetic Resonance in Medicine*, 2002, pp. 990-1000, vol. 47.

(Continued)

*Primary Examiner*—Louis M. Arana
(74) *Attorney, Agent, or Firm*—Saliwanchik, Lloyd & Saliwanchik

(57) ABSTRACT

Embodiments of the subject invention can utilize a single coil structure for dual-mode operation. In a specific embodiment, a single coil structure can be used as a volume coil in the transmitting phase and as a phase array in the receiving phase. In an embodiment, a transmit coil array in accordance with the subject invention can be utilized for one or more of the following: 1) parallel RF excitation on an MRI scanner equipped with a multiple-channel transmitter; 2) serial RF excitation with the use of a switch system with a single channel transmitter; and 3) generation of a homogeneous $B_1$ field for regular MRI with the use of a power splitter on a standard scanner. In a specific embodiment, the use of a concentric double loop coil with different tunings of inner and outer loops can be implemented. In an embodiment, the coil elements can be decoupled using the CRC mode of a concentric double loop coil. In an embodiment, a surface coil transmit array can provide better compatibility with a receive array. In a specific embodiment, an over-coupled technique can be used to improve the phase control of the transmitting pulse.

10 Claims, 9 Drawing Sheets

U.S. PATENT DOCUMENTS

| | | |
|---|---|---|
| 6,608,480 B1 | 8/2003 | Weyers |
| 6,714,013 B2 | 3/2004 | Misic |
| 7,012,429 B1 * | 3/2006 | Ledden ............... 324/318 |
| 2003/0184293 A1 * | 10/2003 | Boskamp et al. ........... 324/318 |

OTHER PUBLICATIONS

Abduljalil, A.M., et al., SENSE Imaging with Multi-Port TEM Coils at Ultra High Field, *Proc. Intl. Soc. Mag. Reson. Med*, 2003, p. 473, vol. 11.

Adriany, G., et al., Shielded Surface Coils and Halfvolume Cavity Resonators for Imaging and Spectroscopy Applications at 7 Tesla, *Proc. Intl. Soc. Mag. Reson. Med*, 2000, p. 563, vol. 8.

Boskamp, E.B., et al., Whole Body LPSA transceive array with optimized transmit homogeneity, *Proc. Intl. Soc. Mag. Reson. Med.*, 2002, p. 903, vol. 10.

Li, Y, et al., A Head Coil Design Using a Single Coil Structure of Dual Operation Modes for Homogeneous Volume Excitation and Parallel Signal Acquisition in High Field Imaging, *Proc. Intl. Soc. Mag. Reson. Med.*, May 7, 2005, p. 954, vol. 13.

\* cited by examiner

HIGH FIELD HEAD COIL FOR DUAL-MODE OPERATION IN MAGNETIC RESONANCE IMAGING

CROSS-REFERENCE TO RELATED APPLICATION

The present application claims the benefit of U.S. provisional patent application Ser. No. 60/644,439, filed Jan. 14, 2005, which is hereby incorporated by reference herein in its entirety, including any figures, tables, or drawings.

BACKGROUND OF THE INVENTION

In most head coil designs, a double coil structure is used. Typically, the outside coil is a volume coil for RF excitation and the inner coil is a surface coil array for signal reception.

In head imaging, two important design criteria for the coil design are homogeneity in RF excitation and sufficient sensitivity in signal reception. These requirements are usually achieved using the combination of a volume coil, such as a TEM or Birdcage coil, and a surface coil array with active decoupling circuits.

It has been shown that placing a shield on the side of a surface coil can offer good decoupling. This is equivalent to the use of a counter rotating current (CRC) coil, which is also efficient in coil decoupling. However, placing a shield on the side of a surface coil does not allow good control in the coil decoupling.

DETAILED DISCLOSURE

Embodiments of the subject invention can utilize a single coil structure for dual-mode operation. Embodiments of the invention pertain to a method for utilizing a single coil structure for dual mode operation. In a specific embodiment, a single coil structure can be used as a volume coil in the transmitting phase and as a phase array in the receiving phase. In an embodiment, a transmit coil array in accordance with the subject invention can be utilized for one or more of the following: 1) parallel RF excitation on an MRI scanner equipped with a multiple-channel transmitter; 2) serial RF excitation with the use of a switch system with a single channel transmitter; and 3) generation of a homogeneous $B_1$ field for regular MRI with the use of a power splitter on a standard scanner. In a specific embodiment, the use of a concentric double loop coil with different tunings of inner and outer loops can be implemented. In an embodiment, the coil elements can be decoupled using the CRC mode of a concentric double loop coil. In an embodiment, a surface coil transmit array can provide better compatibility with a receive array. In a specific embodiment, an over-coupled technique can be used to improve the phase control of the transmitting pulse.

Figure 1:
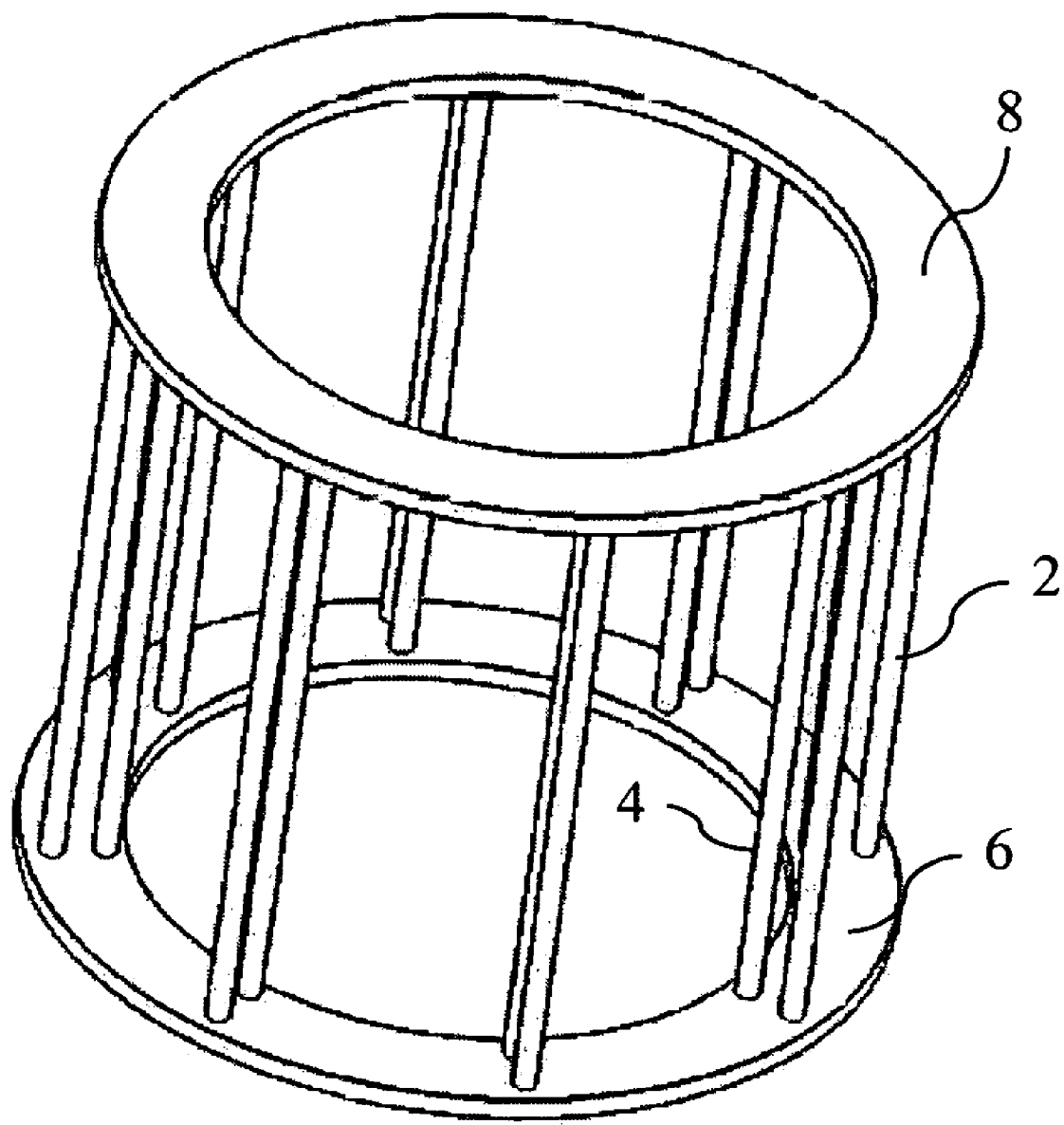
FIG. 1 shows an embodiment of a coil for use in magnetic resonance imaging in accordance with an embodiment of the subject invention.
Figure 2:
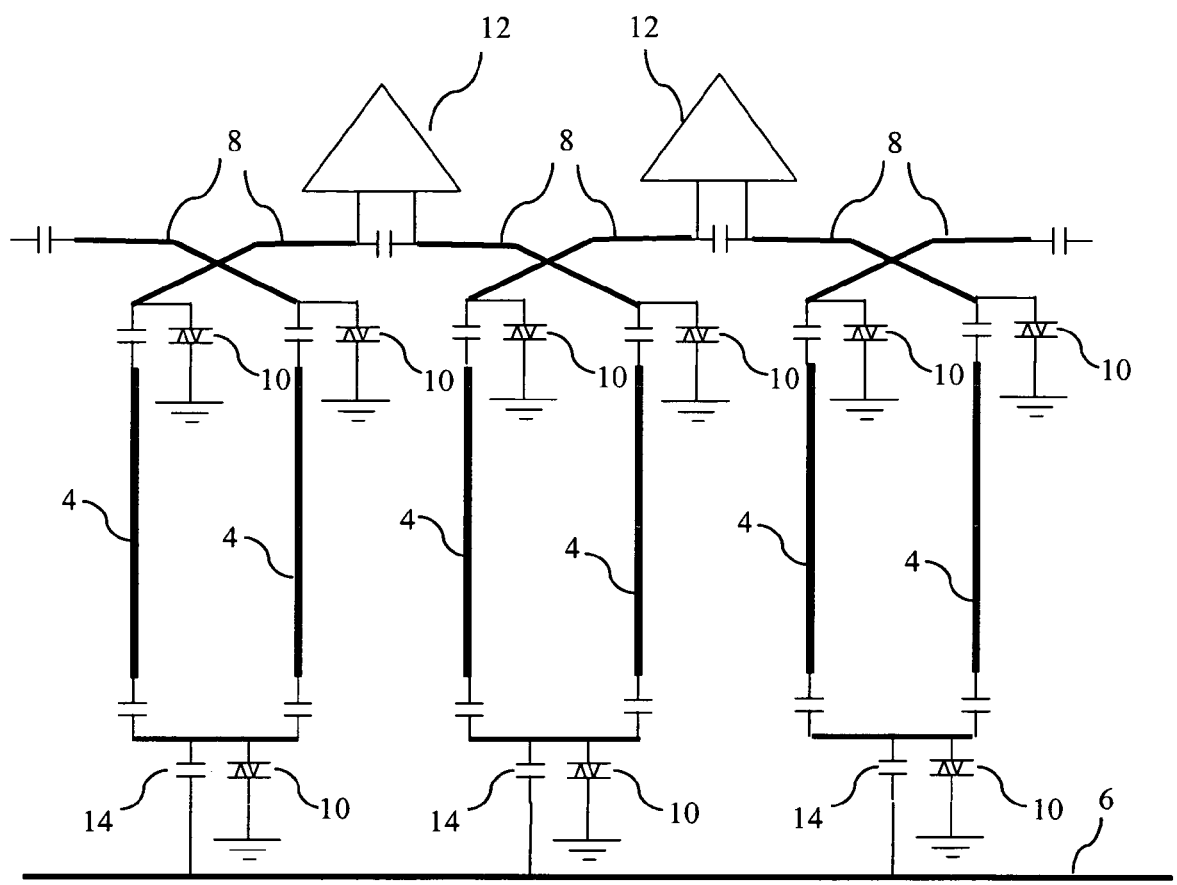
FIG. 2 shows a circuit diagram for decoupling between transmitting structure and receiving structure for the coil in FIG. 1, in accordance with an embodiment of the subject invention.

In a specific embodiment, an array structure is constructed directly from the elements in the volume coil. In a further specific embodiment, each element of a TEM coil structure can be connected to a low input impedance preamplifier so as to receive signals simultaneously from all the elements. However, SNR may suffer from the weak coupling between a single element and the sample. To improve sensitivity coverage, larger coil loops can be formed by connecting two elements of the TEM coil. FIG. 1 shows the coil structure of a specific embodiment of the subject invention. FIG. 2 shows a circuit configuration that can be used in accordance with this embodiment of the subject invention.

Referring to FIG. 1, a modified 8-leg TEM coil structure in accordance with the subject invention is shown. Although this embodiment incorporates 8 rungs on the inside and 8 rungs on the outside to make 8 legs, other numbers of legs can be used. Preferably an even number of legs can be used. Specific embodiments can use 16 or 32 legs, although the number of legs is not limited to powers of 2. The outer rungs 2 are grounded. The inner rungs 4 carry the currents for $B_1$ field generation. In the embodiment shown, two washers 6 and 8, machined from PCB circuit board, are used to support the inner and outer rungs and provide a grounded shield. The end-ring structure for mode degeneration and the circuit structures for decoupling are shielded out of the ground layer.

FIG. 2 shows a circuit diagram for decoupling between transmitting structure and receiving structure. Referring to FIG. 2, the circular structure is unfolded on a flat plane. Only six of the inner rungs 4 in the TEM coil structure from FIG. 1 are shown. Each coil loop is connected to a low input impedance preamplifier 12 (note that only 2 preamplifiers of the 4 are shown in FIG. 2). All the diodes are switched on during the transmitting phase and off during the receiving phase. When the diode packs 10 are switched on during the transmitting phase, they form a short allowing a direct connection between the inner rung 4 and the outer rung 2 for each leg. In this way current travels in the inner rungs 4 and produces transmit RF signals for MRI. When the diode packs are switched off during the receiving phase, current can be induced in the receive coils formed by the path from the preamplifier 12, along a portion of ring shield 8, down one of the inner rungs 4, along the other ring shield 6, back up another inner ring 4, and back over to the preamplifier 12 via a portion of ring shield 8. In the embodiment shown in FIG. 2, the receive coils are formed by the paths utilizing the $1^{st}$ and $4^{th}$ inner rungs 4, and the $3^{rd}$ and $6^{th}$ inner rungs 4, and the $5^{th}$ and $8^{th}$ (not shown) inner rungs 4, and the $7^{th}$ (not shown) and 2$^{nd}$ inner rungs 4. Other permutations of inner rungs 4 can be utilized to make the receive coils, particularly in embodiments having 16, 32, or other number of legs. The mutual coupling between two adjacent loops are suppressed using a shared capacitor 14 and some overlap of two loops.

A concentric double loop surface coil can be used to produce two resonance modes: a co-rotating current mode and a counter-rotating current (CRC) mode. In the CRC mode, the magnetic field produced can be reduced due to the opposing currents of the inner and outer coil loops. The degree of this field reduction depends on the current ratio between the inner loop and the outer coil, which can be easily adjusted by tuning the two coil loops. In an embodiment, double loop surface coils can be used to make up a transmit array and tuned to the CRC mode, with the inductive coupling between coil elements controlled by tuning capacitors.

Figure 3:
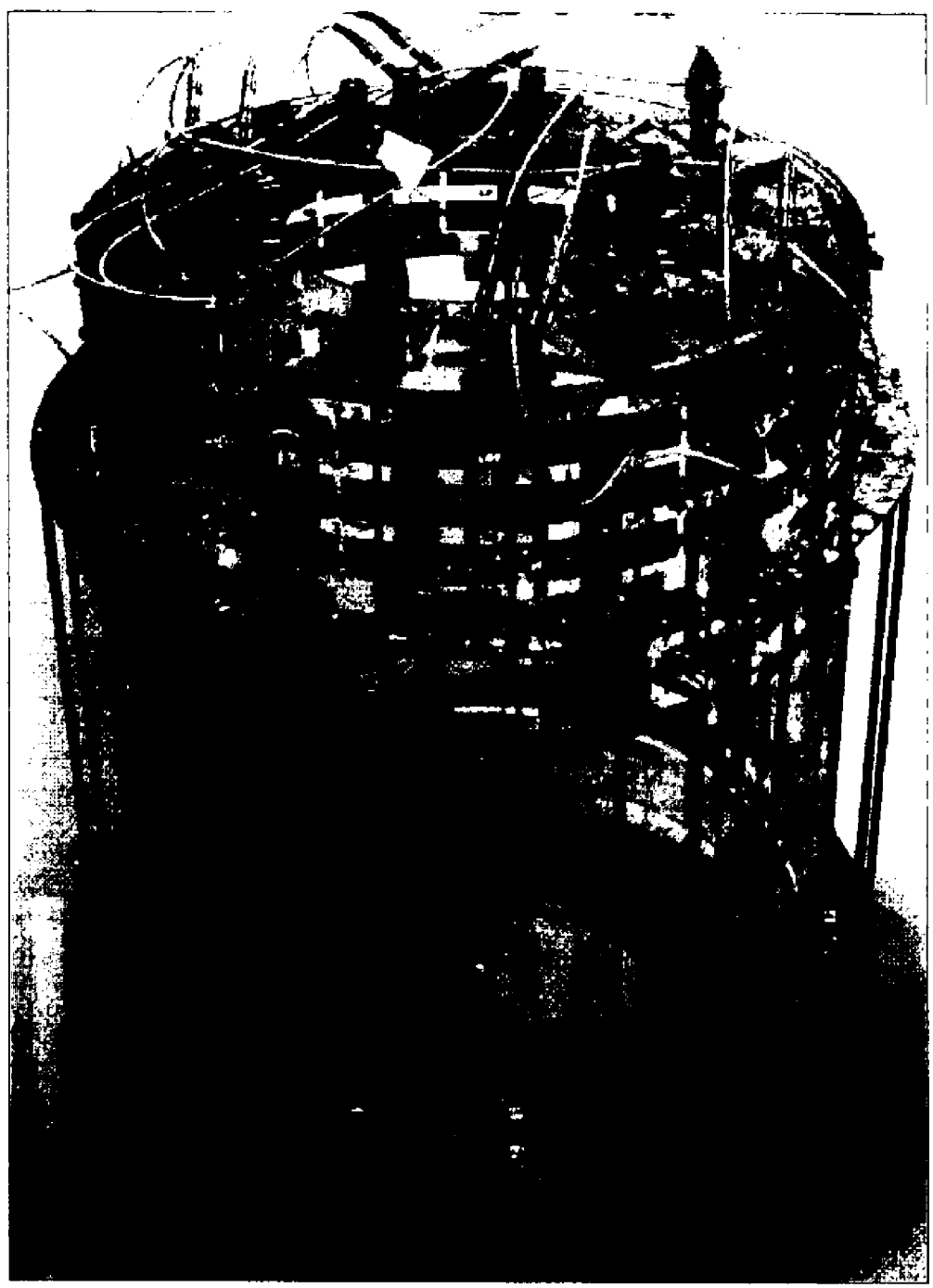
FIG. 3 shows a photograph of a coil that is schematically shown in FIG. 9, in accordance with an embodiment of the subject invention.
Figure 4:
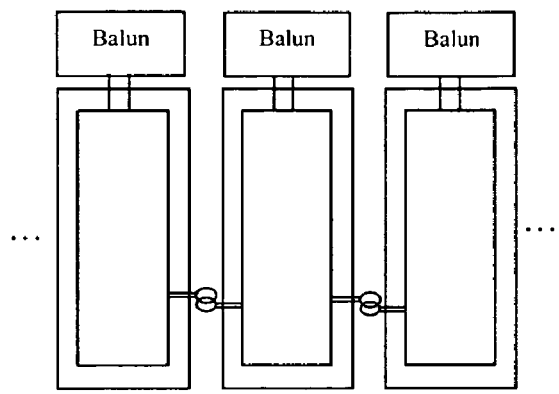
FIG. 4 shows a schematic of a portion of the transmit coil array shown in FIG. 3, in accordance with an embodiment of the subject invention.

FIG. 3 shows an eight-element transmit array, in accordance with the subject invention, utilizing tuning capacitors to decouple the double loop surface coils when the transmit array is tuned to the CRC mode. The schematic of the transmit coil array shown in FIG. 3 is shown in FIG. 4. Referring to FIG. 3, eight coils were positioned on a clear acrylic tube of 27 cm in diameter. Each element is a concentric double rectangular loop. The size of the inner loop is 8×13 cm and the size of the outer loop is 9.5×17 cm. The inner and outer loops can be tuned differently such that the coupling between next nearest neighbors can be suppressed to a satisfactory level. Between nearest neighbors, a shared inductor can be used for decoupling. FIG. 4 shows inductive decoupling between adjacent inner loops. In an embodiment, an RF balun was used at the excitation port of every element to remove the coupling through cables. The array can be placed in an RF shield. In the embodiment shown in FIG. 3, the array is placed in an RF shield with a distance of about 16 mm to the coils.

Figure 5:
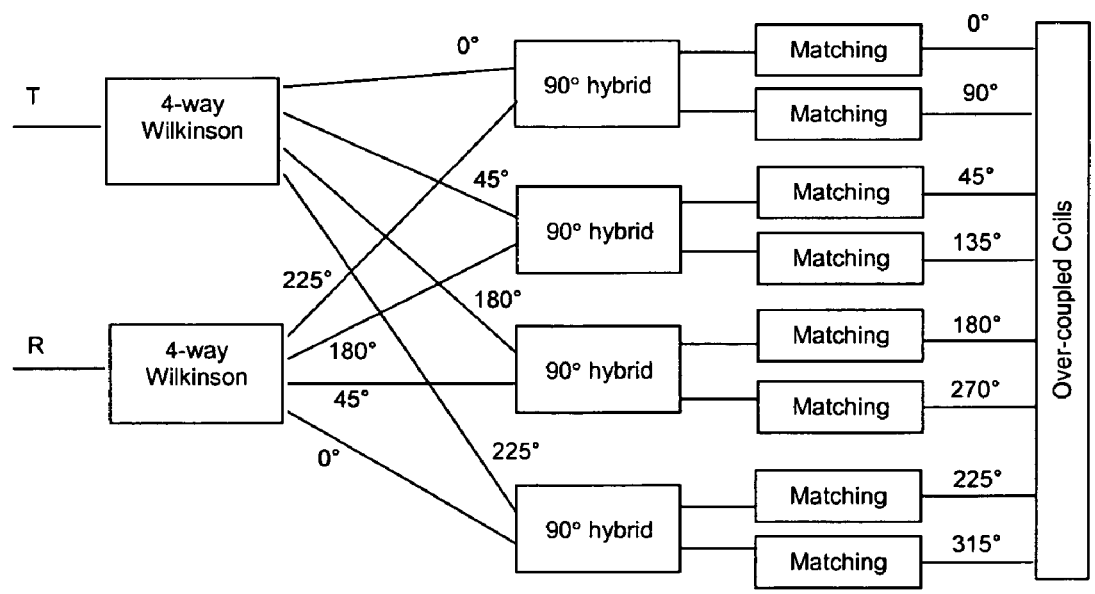
FIG. 5 shows an embodiment utilizing a power splitter design in accordance with an embodiment of the subject invention.

To provide the imaging capability on the MRI scanner equipped with only a one-channel transmitter, an eight-way power splitter was used to excite every coil unit with a phase delay of 45° between nearest neighbors. Because the coil matching is extremely sensitive to loading condition at this field, which dramatically affects the phase control in the RF transmission to every coil unit, the coils were over-coupled to a certain degree such that the phase of the current in every coil is insensitive to the load change. FIG. 5 shows an embodiment implementing a power splitter design.

Embodiments of the invention can include a combination of volume coil and a receive coil array. Additional embodiments can include a transmit/receive coil array. The same resonator structure can be used in transmit and receive mode. In an embodiment having a combination of a volume coil and a receive coil array, active decoupling circuits (such as a diode network) can be used to switch the configuration of the coil between rf transmission and signal reception. In an embodiment having a transmit/receive coil array, the mode configuration can be switched using a power splitter and combiner or T/R (transmit/receive) switch.

Figure 6:
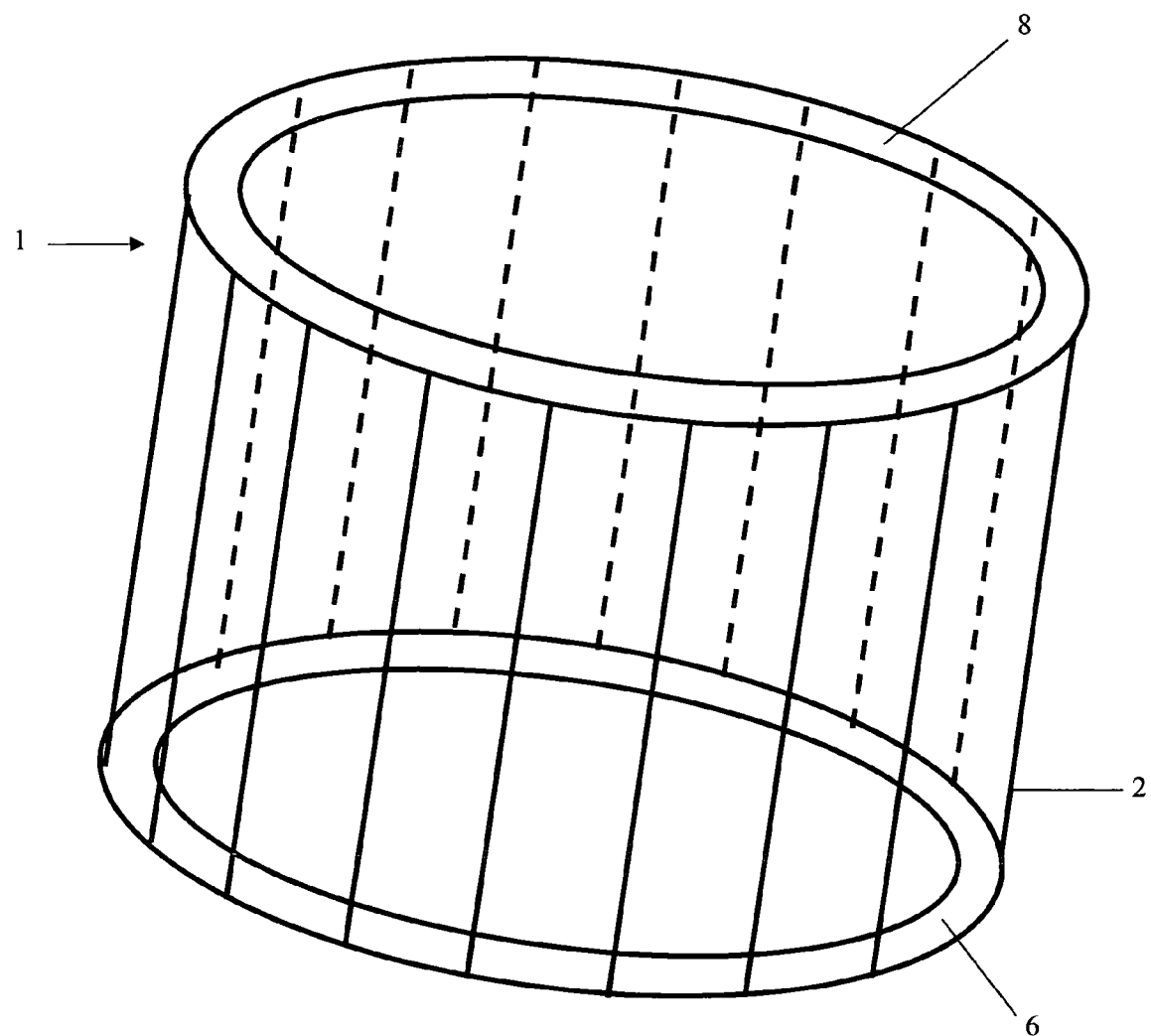
FIG. 6 shows a ground structure in accordance with an embodiment of the subject invention.

The same ground structure shown in FIG. 6 can be utilized with embodiments having a volume coil and a receive coil and in embodiments having a transmit/receive coil array. The ground structure 1 can include multiple rungs 2 connected to two washers, one washer at each of the two ends of the rung. In an embodiment, the inner diameter of each washer can be equal to the coil diameter. Even though 16 rungs are shown in FIG. 6, other numbers of rungs can be also be used. Rungs 2 can be tubing, rods, foil or other shapes. The use of tubing or rods can allow a person to see out of the ground structure from inside the ground structure.

Figure 7:
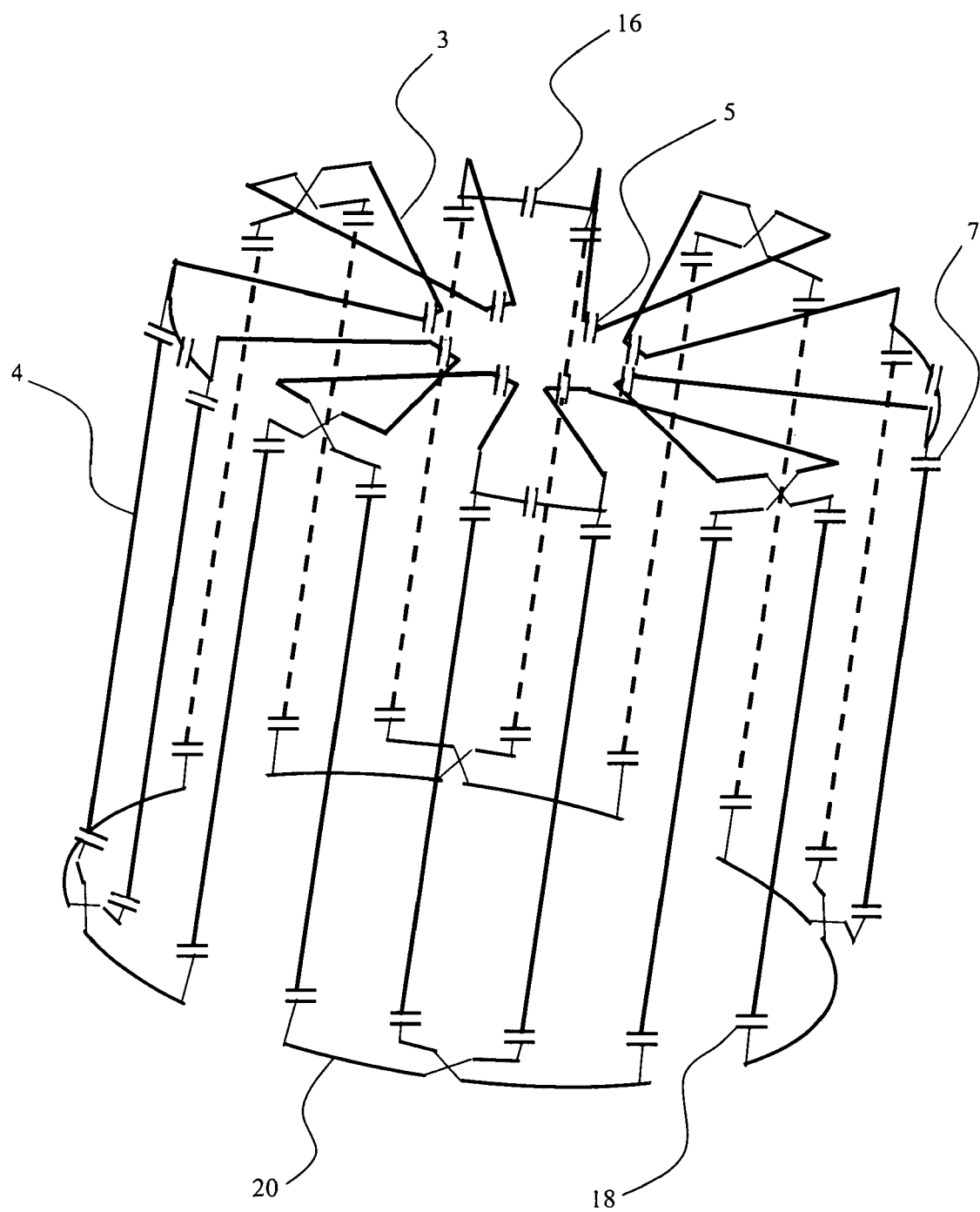
FIG. 7 shows the receive structure for a coil in accordance with an embodiment of the subject invention.

FIG. 7 shows the coil structure in an embodiment of the invention having a volume coil and a receive coil. The coil structure is shown during receive. During transmit, for example as a TEM coil, the rungs 4 connect to ground. The structure can include two parts: 16 rungs (4 in FIG. 7) and the top plate part. In the embodiment shown schematically in FIG. 7, the 16 rungs 4 are placed equally spaced on a cylindrical surface. In an embodiment, the rungs 2 from the ground structure 1 shown in FIG. 6 are positioned at the same angular position as the rungs 4, when the ground structure 1 is placed outside the coil structure.

The cross-over of elements 3, to form a triangular loop in FIG. 7, can be used for decoupling a pair of coils from an adjacent pair of coils. The coil structure of FIG. 7 has 4 pairs of coils used for receiving MR signals. The coil structure is used in MR with the static magnetic field parallel with rungs 4. The rungs 4 can also be positioned such that the cross-section shape of the rungs 4 position in a plane transverse to the static magnetic field is elliptical. Preferably, the ratio of the minor axis of such an ellipse to the major axis is 0.8 or greater. Referring to FIG. 7, capacitors 16 help with decoupling. The 16 rungs 4 in FIG. 7 are segmented into 4 pairs of coils. Each pair of coils utilizes 4 rungs 4 such that the first and third rungs are part of one coil, along with conductors along the top and bottom, and the second and fourth rungs are part of the other coil of the coil pair, along with conductors along the top and bottom. In this way, the coils in the coil pair overlap to reduce coupling.

Figure 8:
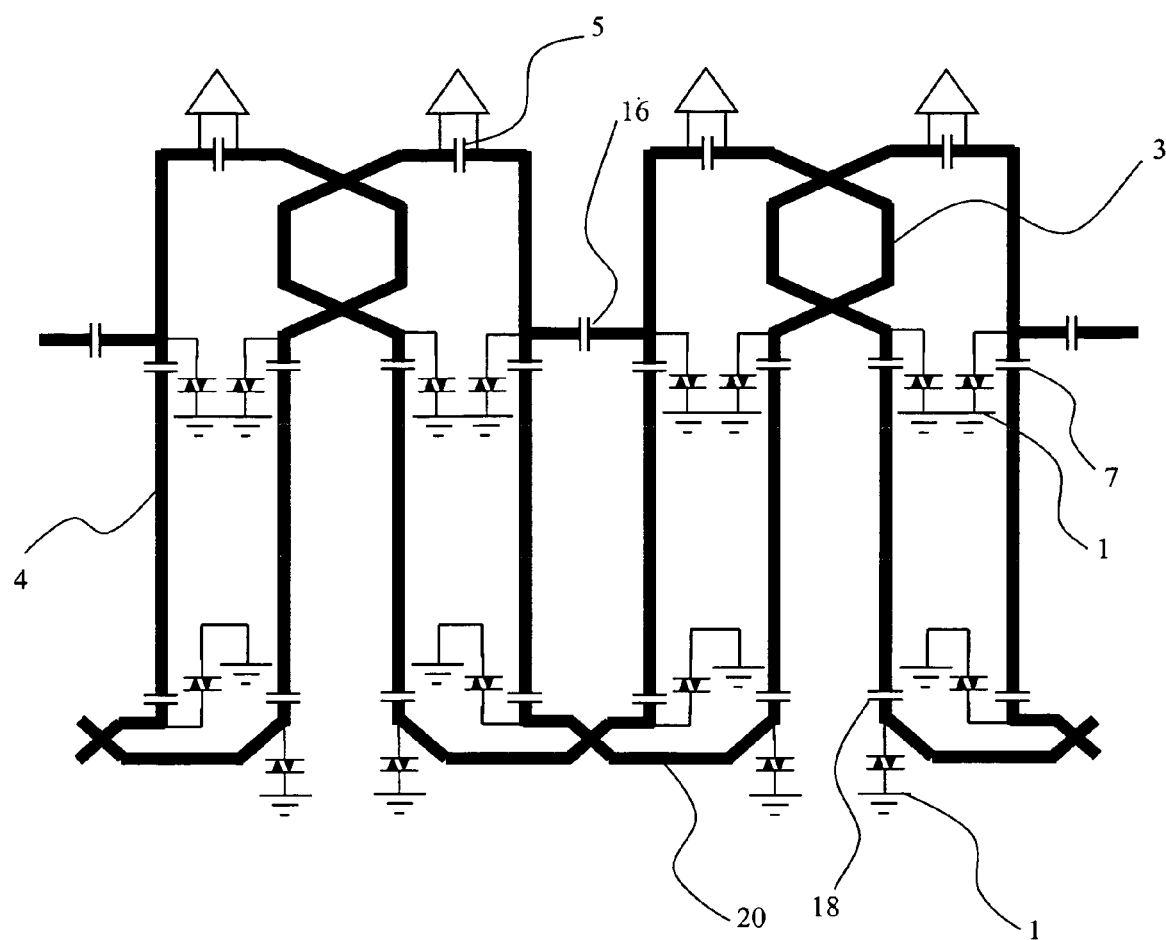
FIG. 8 shows a circuit diagram for decoupling between transmitting and receiving structure for the coil in FIG. 7, in accordance with an embodiment of the subject invention.

FIG. 8 shows the electrical connections of the structures, a portion of which are shown in FIG. 7, in accordance with an embodiment of the invention. During the transmit mode, the diodes are on and ground most of the coil structure. During the transmit mode, the 16 inner rungs 4 are not grounded. Combining the structure shown in FIG. 7 with the ground structure shown in FIG. 6, during transmit the 16 pairs of inner 4 and outer 2 rungs form the basic TEM coil structure, which can be used to implement RF transmission. An example of such a basic TEM coil structure is shown in FIG. 1, for 8 rungs. During the receive mode, the diodes are off and an eight-channel surface coil array is formed based on the inner rung 4 structure, as shown in FIG. 7.

Figure 9:
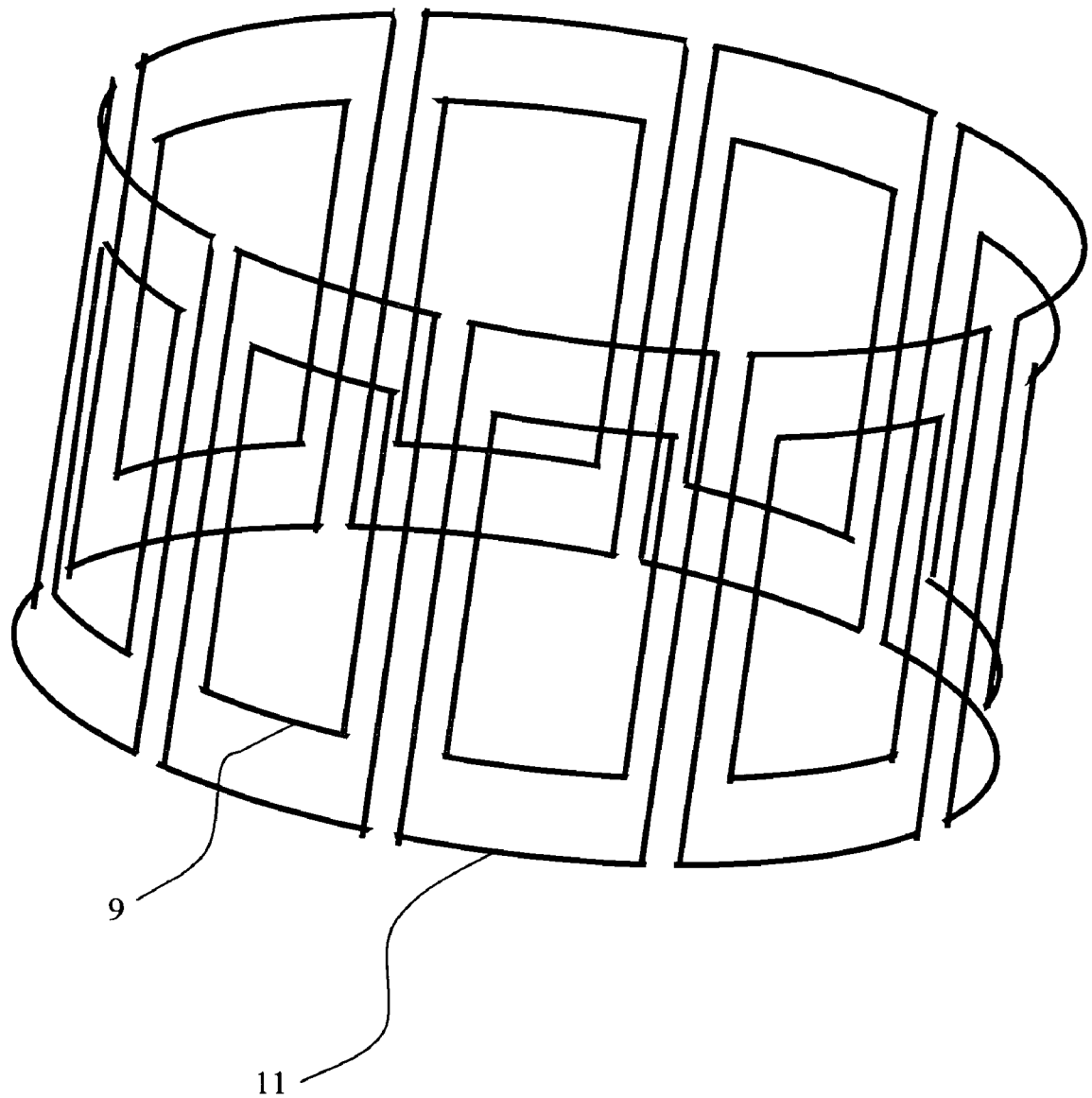
FIG. 9 shows a coil incorporating double-loop coil elements in accordance with an embodiment of the subject invention.

Referring to FIG. 9, in another specific embodiment, eight double-loop coil elements are placed equally spaced on a cylindrical surface. In another embodiment, the cross-section can be elliptical rather than circular. Also, a different number of double-loop coils can be utilized, such as, for example, 4, 16 or 32. The counter rotating current (CRC) mode is used to generate the rf field inside the coil. A stronger rf current is generated in the inner loop than in the outer loop. The currents in the inner and outer loops are in opposite directions. The current ratio between the inner loop and outer loop is dependent on the requirements for the decoupling from next nearest neighbors in the coil array. This ratio can be adjusted by, for example, tuning the inner and outer coil. The decoupling between the nearest neighbors in the coil array can be implemented by sharing the inductance or capacitance. The balun circuit can be connected to the inner loop for rf transmission and signal reception. The coil can be capacitively overcoupled to increase the phase stability for different sample loading conditions. The ground structure shown in FIG. 6 can be placed outside of this coil resonator.

Figure 10:
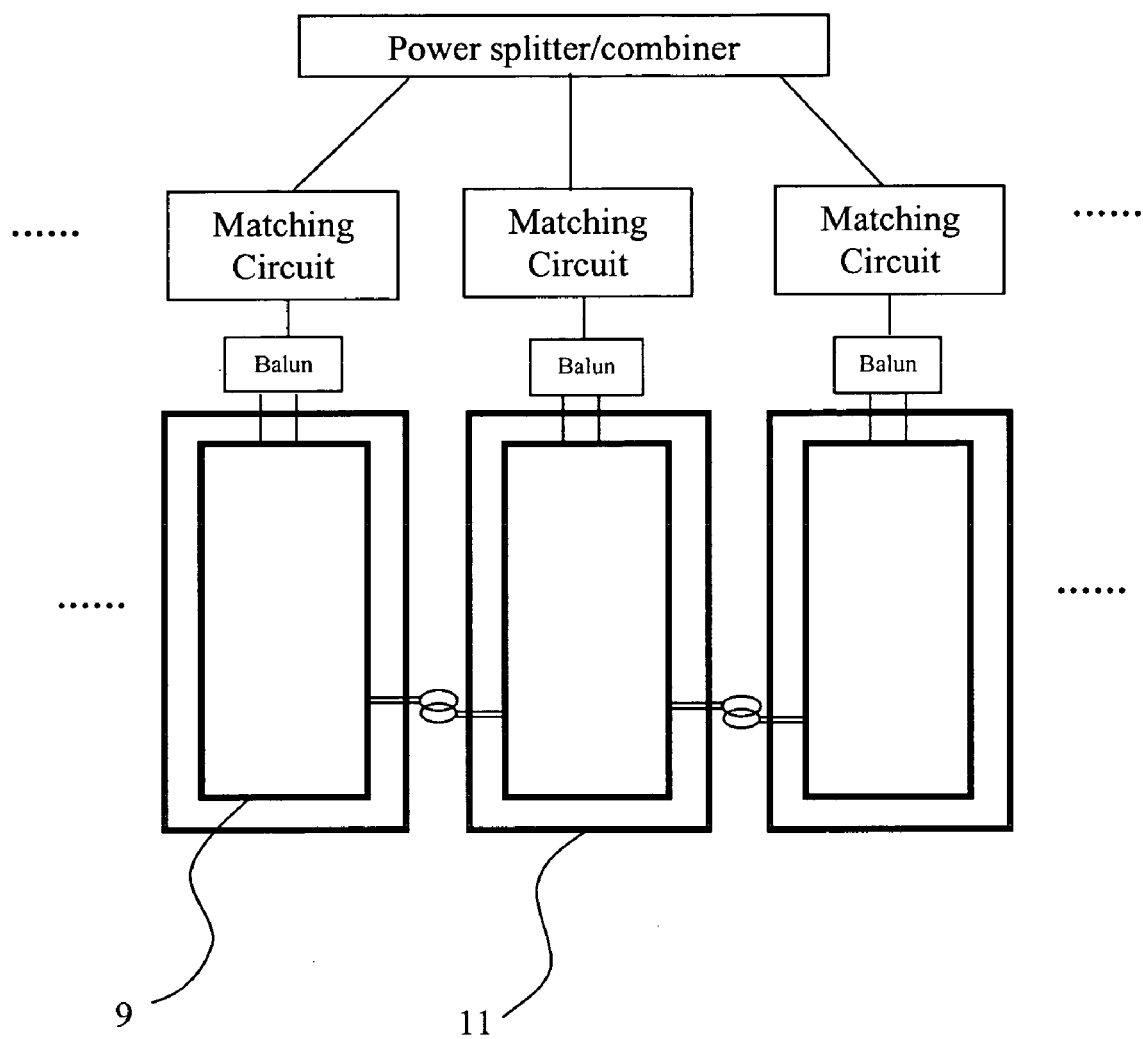
FIG. 10 shows a schematic for utilizing the coil of FIG. 9 in accordance with an embodiment of the subject invention.

The ground structure shown in FIG. 6 can be positioned such that two of rungs 2 are symmetrically positioned outside of the double-loop coil. Other ground structures can be utilized, such as other ground structures having symmetry around the center axis of the cylindrical surface and rungs of tubular structure, rod structure, and/or foil structure. FIG. 10 shows how the baluns, matching circuits, and power splitter/combiner can be utilized with the coil structure of FIG. 9.

FIG. 5 shows an embodiment utilizing the coil structure of FIG. 9 and the ground structure of FIG. 6 to transmit (T) and receive (R), where transmit and receive are interleaved with each other in time. The inner loops 9 are shown inductively coupled to the adjacent inner loop 9 for decoupling purposes. The outer loops 11 are shown in FIG. 10 as well.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A dual-mode coil for magnetic resonance imaging, comprising:
    a coil structure, and
    circuitry to utilize the coil structure to transmit excitation rf magnetic fields to a sample to be imaged in a region of interest and to utilize the coil structure to receive signal rf magnetic fields from the sample to be imaged in the region of interest,
    wherein the coil structure includes a around structure,
    wherein the coil structure comprises a plurality of elongated conductors positioned substantially parallel to a center axis so as to have an elliptical cross-section in a plane transverse to the center axis, wherein the plurality of elongated conductors are utilized by the circuitry to transmit excitation rf magnetic fields to the sample to be imaged, wherein the plurality of conductors are utilized by the circuitry to receive signal rf magnetic fields from the sample to be imaged,
    wherein during transmit the plurality of elongated conductors and the ground structure form a TEM coil structure,
    wherein during receive the plurality of elongated conductors are connected to form a plurality of surface coils, each surface coil incorporating two of the plurality of elongated conductors.

2. The coil according to claim 1, wherein each surface coil of the plurality of surface coils overlaps with an adjacent surface coil of the plurality of surface coils, wherein such overlapping assists decoupling of the adjacent surface coils that overlap.

3. The coil according to claim 2,
    wherein the plurality of surface coils are paired up to form pairs of surface coils such that each surface coil of the pair of surface coils overlaps the other surface coil of the pair of surface coils.

4. The coil according to claim 3,
    wherein each pair of surface coils utilized four sequential elongated conductors of the plurality of elongated conductors such that one of the pair of surface coils incorporates a first and third elongated conductor of the four sequential elongated conductor arid the other of the pair of surface coils incorporates a second and fourth elongated conductor of the four sequential elongated conductors such that the pair of surface coils overlap from the second to the third elongated conductors of the four sequential elongated conductors.

5. The coil according to claim 3,
    wherein the circuitry comprises conductor elements to connect adjacent pairs of surface coils such that the conductor elements form a loop near the two interconnected pairs of surface coils, wherein the loop assists decoupling of the two interconnected pairs of surface coils.

6. The coil according to claim 1,
    wherein each surface coil of the plurality of surface coils overlaps with both adjacent surface coils of the plurality of surface coils, wherein such overlapping assists decoupling of the adjacent surface coils.

7. A dual-mode coil for magnetic resonance imagine, comprising:
    a coil structure, and
    circuitry to utilize the coil structure to transmit excitation rf magnetic fields to a sample to be imaged in a region of interest and to utilize the coil structure to receive signal rf magnetic fields from the sample to be imaged in the region of interest,
    wherein the coil structure includes a ground structure,
    wherein the coil structure comprises a plurality of double-loop coils positioned on a tubular surface having an elliptical cross-section, each having an inner loop and an outer loop, wherein the circuitry utilizes each of the doubleloop coils in the plurality of double-loop coils in a counter rotating current mode during transmit.

8. The coil according to claim 7,
    wherein the magnitude of the inner current in the inner loop is greater than the magnitude of to outer current in the outer loop during transmit, wherein the magnitude of the inner current being greater than the magnitude of the outer loop assist decoupling of the each double-loop coil from next nearest neighbor double-loop coils.

9. The coil according to claim 8, further comprising:
    shared inductance between nearest neighbor inner loops, wherein shared inductance between nearest neighbor inner loops assist decoupling between nearest neighbor near neighbor double-loops.

10. The coil according to claim 9, further comprising:
    a corresponding plurality of balun circuits, each balun circuit connected to an inner loop for transmit and receive.

* * * * *

UNITED STATES PATENT AND TRADEMARK OFFICE
CERTIFICATE OF CORRECTION

PATENT NO. : 7,253,622 B2 Page 1 of 1
APPLICATION NO. : 11/334241
DATED : August 7, 2007
INVENTOR(S) : Charles Albert Saylor and Yu Li It is certified that error appears in the above-identified patent and that said Letters Patent is hereby corrected as shown below:

Column 4,
Line 38, "inner 4 and outer 2 rungs" should read -- inner 4 and outer 2 rungs --.

Column 5,
Line 31, "a around structure" should read -- a ground structure --.
Line 38, "plurality of conductors" should read -- plurality of elongated conductors --.

Column 6,
Line 6, "arid the other" should read -- and the other --.
Line 37, "doubleloop coils" should read -- double-loop coils --.
Line 42, "of to outer current" should read -- of the outer current --.
Lines 50-51, "nearest neighbor near neighbor" should read -- nearest neighbor --.

Signed and Sealed this

Second Day of September, 2008

JON W. DUDAS
*Director of the United States Patent and Trademark Office*